(12) United States Patent
Kadosh

(10) Patent No.: US 7,352,217 B1
(45) Date of Patent: Apr. 1, 2008

(54) LOCK PHASE CIRCUIT

(75) Inventor: Aviran Kadosh, Misgav (IL)

(73) Assignee: Marvell Semiconductor Israel Ltd., Yokneam (IL)

(*) Notice: Subject to any disclaimer, the term of this patent is extended or adjusted under 35 U.S.C. 154(b) by 456 days.

(21) Appl. No.: 10/752,818

(22) Filed: Jan. 6, 2004

Related U.S. Application Data

(60) Provisional application No. 60/482,968, filed on Jun. 26, 2003.

(51) Int. Cl.
*H03L 7/06* (2006.01)

(52) U.S. Cl. .................... 327/156; 327/162

(58) Field of Classification Search .......... 327/141, 327/154, 160–163, 165, 166, 156; 713/500–503; 714/724–734
See application file for complete search history.

(56) References Cited

U.S. PATENT DOCUMENTS

| | | | |
|---|---|---|---|
| 5,560,002 A | 9/1996 | Kardach et al. | 713/500 |
| 5,592,493 A * | 1/1997 | Crouch et al. | 714/729 |
| 6,029,263 A * | 2/2000 | Gibson | 714/726 |
| 6,070,260 A | 5/2000 | Buch et al. | 714/731 |
| 6,407,613 B1 * | 6/2002 | Jaynes et al. | 327/415 |
| 6,427,217 B1 | 7/2002 | Hartnett | 714/733 |
| 6,584,591 B1 | 6/2003 | Taylor | 714/731 |
| 6,593,782 B2 * | 7/2003 | Pierschel et al. | 327/115 |

* cited by examiner

*Primary Examiner*—Kenneth B. Wells
*Assistant Examiner*—Ryan C. Jager

(57) ABSTRACT

Systems and techniques for producing a signal with a known phase relationship to a source clock at an output of an indeterminate circuit element such as a clock divider. The systems and techniques may be used to allow circuit test data to be accurately compared with simulation data.

35 Claims, 2 Drawing Sheets

LOCK PHASE CIRCUIT

CROSS REFERENCE TO RELATED APPLICATIONS

The present application claims priority to commonly assigned U.S. Provisional Patent Application No. 60/482,968 filed on Jun. 26, 2003, which is hereby incorporated by reference in its entirety.

TECHNICAL FIELD

This invention relates to integrated circuits, and more particularly to testing integrated circuits.

BACKGROUND

Integrated circuits (ICs) are manufactured by patterning and forming device structures on substrates such as silicon wafers. A number of chips including one or more ICs may be formed on a single wafer. The chips are then separated, packaged, and tested.

Manufacturing or other defects may cause a chip to perform differently than expected. Therefore, chips are generally tested prior to shipment to ensure that they meet performance specifications. A number of different test types may be used to test chip performance, including functional vector testing. In a functional vector test, the chip is in normal operating mode (e.g., the clock has a functional connection). Test vectors (test bit streams) are injected on one or more of the chip's input pins. Resulting output data from one or more output pins is captured, then compared to simulation data to determine whether the chip performs as required.

SUMMARY

Systems and techniques described herein may be used to produce a signal of a known phase relationship to a source clock at the output of an indeterminate circuit element such as a clock divider. Accordingly, the systems and techniques provide for more efficient testing, since test data can be accurately compared to simulation data.

In general, in one aspect, a phase lock circuit comprises an input of an integrated circuit configured to receive a phase lock signal. The circuit further includes a clock configured to generate a clock signal. The circuit further includes phase lock circuitry in communication with the input and the clock, the phase lock circuitry configured to generate a phase lock pulse based on the phase lock signal and the clock signal The circuit further includes a phase indeterminate circuit element, such as a clock divider, configured to receive the phase lock pulse and to generate an output signal having a known phase relationship to the clock signal and based on the phase lock pulse.

The phase lock circuitry may include sampling circuitry configured to generate a sampling output based on the phase lock signal, the sampling output having a known phase relationship to the clock signal. The phase lock circuitry may further include pulse generation circuitry configured to generate a phase lock pulse based on the sampling output. The sampling circuitry may include one or more sampling flip flops. The pulse generation circuitry may comprise one or more logic gates.

The phase lock circuitry may comprise pulse generation circuitry configured to generate an output pulse based on the phase lock signal. The circuitry may further include sampling circuitry configured to generate the phase lock pulse based on the output pulse. In some implementations, the lock phase circuit may be included in an integrated circuit.

In general, in another aspect, a phase lock circuit comprises input means for receiving an input phase lock signal. The circuit may further include timing means for generating a timing signal, and means for generating a phase lock pulse based on the phase lock signal and the timing signal. The phase lock circuit may include a phase indeterminate means in communication with the timing means and the means for generating a phase lock pulse, the phase indeterminate means for generating an output signal based on the phase lock pulse and having a known phase relationship to the timing signal.

In general, in another aspect, a method of testing a circuit may include receiving a phase lock signal on a circuit input. The method may further include receiving a clock signal. The method may further include generating a phase lock pulse based on the phase lock signal and the clock signal. The method may further include receiving the phase lock pulse in a phase indeterminate circuit element, and generating an output of the phase indeterminate circuit element, where the output of the phase indeterminate circuit element has a known phase relationship to the clock signal. In some implementations, the phase indeterminate element may be a clock divider.

Generating the phase lock pulse based on the phase lock signal and the clock signal may comprise generating a first signal based on the phase lock signal and the clock signal and generating the phase lock pulse based on the first signal. Generating the first signal based on the phase lock signal and the clock signal may comprise delaying the phase lock signal to substantially synchronize at least a portion of the first signal with at least a portion of the clock signal.

Generating the phase lock pulse based on the phase lock signal and the clock signal may comprise generating a first pulse based on the phase lock signal and generating the phase lock pulse based on the first pulse. Generating the phase lock pulse based on the first pulse may comprise delaying the first pulse to substantially synchronize at least a portion of the first pulse with at least a portion of the clock signal.

The method may further comprise inserting test input data on a test input of the circuit, and receiving test output data on a test output of the circuit. The method may further comprise comparing the test output data to simulation data. The simulation data may be based on a known phase relationship.

The details of one or more implementations are set forth in the accompanying drawings and the description below. Other features and advantages will be apparent from the description and drawings, and from the claims.

DESCRIPTION OF DRAWINGS

Like reference symbols in the various drawings indicate like elements.

DETAILED DESCRIPTION

Problems may arise during functional vector testing due to indeterminate elements; for example, elements whose output signals have an indeterminate phase relationship with a clock signal. For example, in a chip incorporating one or more clock dividers, the output phase of the clock divider may be indeterminate during a functional test. The output of the clock divider may have one of two possible phase relationships with respect to the phase of a source clock, which may be referred to as a zero phase state and a 180 degree phase state. As a result, the captured output may differ depending on whether the clock divider is in the zero phase state or the 180 degree phase state.

Figure 1:
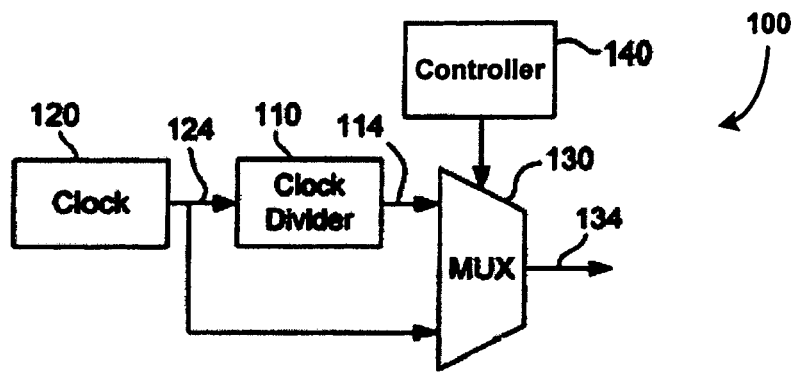
FIG. 1 is a schematic of a system to produce a signal with a known phase relationship to a source clock at an output of a clock divider.

FIG. 1 shows a system 100 that may be used to produce a signal of a known phase relationship to a clock signal at the output of a clock divider 110 during a functional test. Clock divider 110 receives a clock signal 124 from a clock 120. Clock signal 124 and the output 114 of clock divider 110 are input to a multiplexer (mux) 130. A mux controller 140 controls the output of mux 130. In functional test mode, the output 134 of mux 130 is the signal from clock signal 124. In normal operating mode, the output 134 of mux 130 is controlled to be the signal from clock divider 110.

System 100 allows the relative phase at the output of mux 130 to be known, and thus allows accurate comparison of captured output data with simulation data. However, since mux 130 operates both during testing and during normal circuit operation, it provides a continuous load on the clock signal. This may lead to undesirable consequences, such as jitter in the clock signal.

Systems and techniques described herein may provide a known relative phase at the output of a phase indeterminate circuit element such as a clock divider without unduly loading the output of a divided clock or the output of the circuit element. For example, in some implementations, logic is provided at an input of a clock divider to set the output phase of the clock divider with respect to a source clock signal. Providing logic at the input of the clock divider, rather than at the output of the clock divider, does not load the divided clock at all. This can avoid the problems noted above.

Figure 2A:
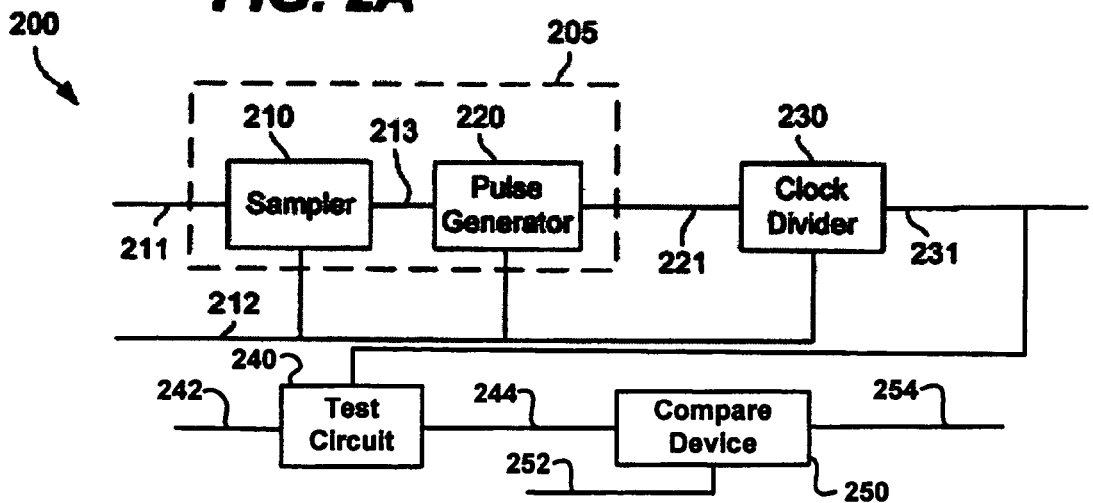
FIGS. 2A and 2B are schematics of implementations of a system to produce a signal with a known phase relationship to a source clock at an output of an indeterminate circuit element such as a clock divider.

FIG. 2A shows a system 200 including phase lock circuitry 205 to produce a signal of a known relative phases at an output of a phase indeterminate element such as a clock divider 230. Phase lock circuitry 205 includes a sampler 210 and a pulse generator 220.

Sampler 210 receives a lock phase signal 211 and a source clock signal 212, and may substantially synchronize lock phase signal 211 with source clock signal 212. For example, sampler 210 may delay lock phase signal 211 to substantially coincide with a rising or falling edge of source clock signal 212. Substantial synchronization refers to a level of synchronization that allows the circuit to perform acceptably; e.g., there may still be a time difference between lock phase signal 211 and an edge of source clock signal 212.

An output signal 213 of sampler 210 is input to pulse generator 220, which generates a lock phase pulse 221 in accordance with the output signal 213 of sampler 210 and source clock signal 212. Clock divider 230 generates a divided clock signal 231 of the source clock signal 212 with a phase based on the phase of lock phase pulse 221.

FIG. 2A also includes a test circuit 240 receiving a test input 242 and divided clock signal 231, and producing a test output 244. A compare device 250 receives test output 244 and a simulation data input 252 and produces a result 254.

Figure 2B:
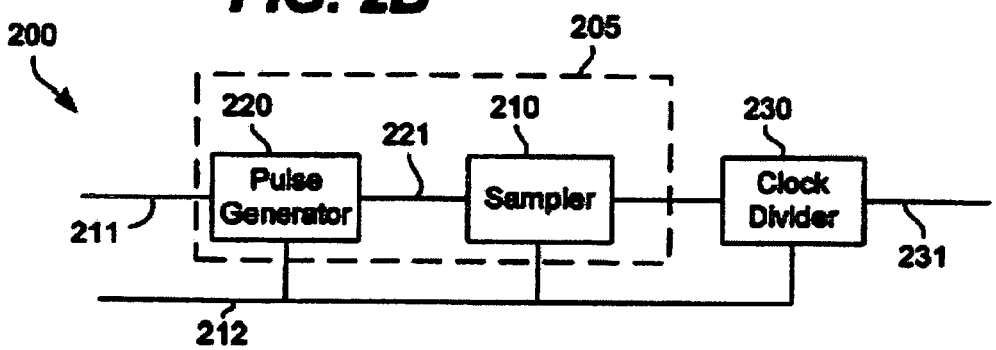

FIG. 2B shows an alternate implementation of phase lock circuitry 205. In FIG. 2B, pulse generator 220 generates a lock phase pulse 221 prior to synchronization with source clock 212. Of course, other implementations are possible.

Figure 3A:
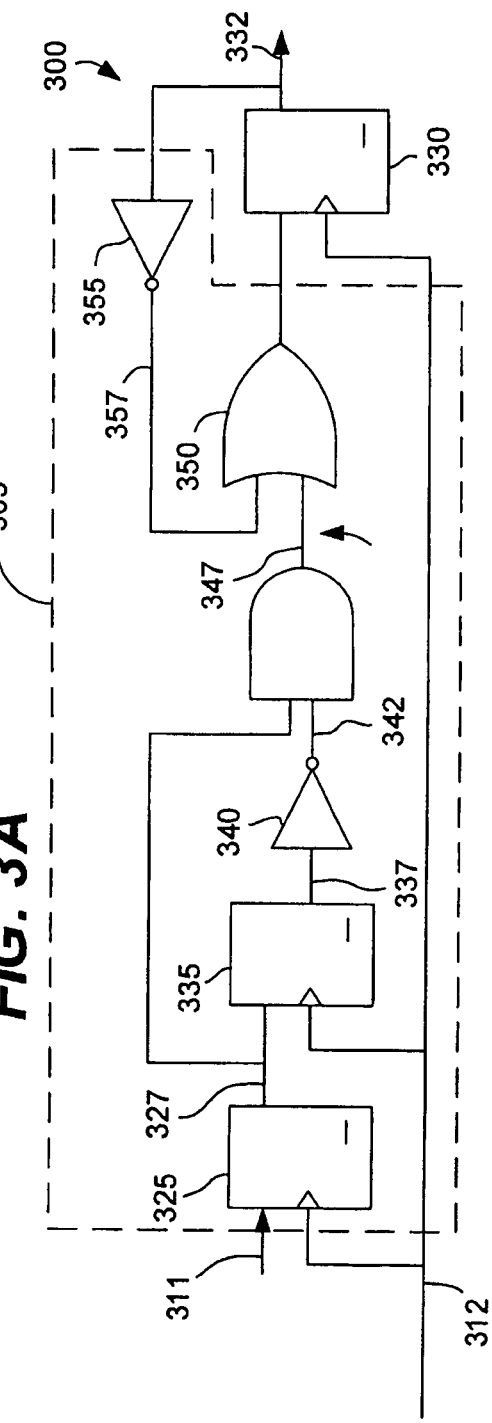
FIG. 3A is a schematic of an implementation of a system to produce a signal with a known phase relationship to a source clock at an output of a clock divider.

FIG. 3A shows an implementation of a system 300 for generating a signal of a known relative phase at an output of a clock divider 330. Phase lock circuitry 305 includes a first flip flop 325. First flip flop 325 receives a lock phase signal 311 and a source clock signal 312. Lock phase signal 311 may be a signal from a chip input pin; for example, a signal generated in an external testing device and applied to an input pin of the chip being tested.

A second flip flop 335 receives an output 327 of first flip flop 325 and source clock signal 312. First flip flop 325 and second flip flop 335 may substantially synchronize lock phase signal 311 with source clock signal 312. An output 337 of second flip flop 335 is provided to a NOT gate 340. An output 342 of NOT gate 340 and output 327 of first flip flop 325 are input to an AND gate 345, which generates a lock phase pulse 347 at its output.

An OR gate 350 generates an output 352, which is input to a clock divider 330. Source clock signal 312 is also input to clock divider 330. Clock divider 330 generates an output signal 332 at its output, which is input to a NOT gate 355. An output 357 of NOT gate 355, as well as lock phase pulse 347, are input to OR gate 350. The resulting output 332 of clock divider 330 has a known phase relationship with source clock signal 312.

Figure 3B:
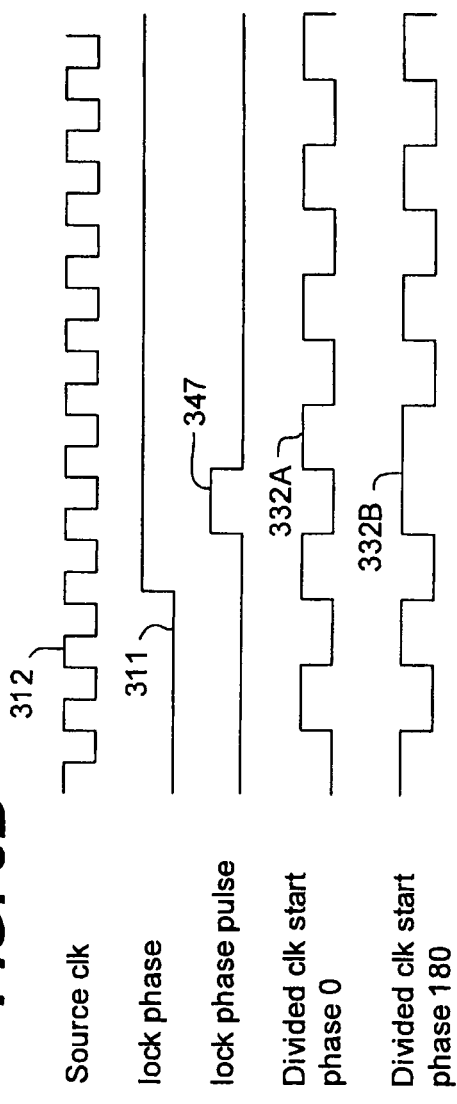
FIG. 3B shows some signals that may be generated using a system such as the system of FIG. 3A.

FIG. 3B shows some signals that may be generated during the operation of system 300. Prior to locking the phase of clock divider 330 using a lock phase signal 311, the output of clock divider 330 may be either of output 332A (which may be referred to as the zero phase signal) or output 332B (which may be referred to as the 180 degree phase signal).

Lock phase signal 311 is provided to an input pin of the chip, and lock phase pulse 347 is generated by system 300 as described above. At the next edge of the output 332 of clock divider 330, the phase of the output with respect to the source clock domain will be known. As shown in FIG. 3B, at the next edge of the output 332 following lock phase pulse 347, the signal goes from a logical 1 to a logical 0 for both signals 332A and 332B (although implementations in which it goes from a logical 0 to a logical 1 may be used as well). As FIG. 3B illustrates, signals 332A and 332B both have the same (known) phase relationship with clock signal 312 subsequent to the phase lock pulse.

A number of implementations have been described. Nevertheless, it will be understood that various modifications may be made without departing from the spirit and scope of the invention. For example, in some implementations, different logic may be used to implement the phase lock circuitry. As noted above, the order of the logic may also be different than that shown. Additionally, although the systems and techniques herein have been described with relation to chip-level testing, they may be applied under other testing scenarios. Accordingly, other implementations are within the scope of the following claims.

What is claimed is:

1. A phase lock circuit, comprising:
   an input configured to receive a phase lock signal;
   a clock configured to generate a clock signal;
   phase lock circuitry in communication with the input and the clock, the phase lock circuitry configured to generate a phase lock pulse based on the phase lock signal and the clock signal; and
   a phase indeterminate circuit element producing an output signal having a first phase, the phase indeterminate circuit element configured to receive the phase lock pulse and to generate an adjusted output signal, having a second phase, based on the phase lock pulse, the adjusted output signal having a known phase relationship to the clock signal.

2. The circuit of claim 1, wherein the phase lock circuitry comprises:
   sampling circuitry configured to generate a sampling output based on the phase lock signal, the sampling output having a known phase relationship to the clock signal; and
   pulse generation circuitry configured to generate the phase lock pulse based on the sampling output.

3. The circuit of claim 2, wherein the sampling circuitry comprises at least one sampling flip flop.

4. The circuit of claim 2, wherein the pulse generation circuitry comprises at least one logic gate.

5. The circuit of claim 1, wherein the phase lock circuitry comprises:
   pulse generation circuitry configured to generate an output pulse based on the phase lock signal; and
   sampling circuitry configured to generate the phase lock pulse based on the output pulse, the phase lock pulse having a known phase relationship to the clock signal.

6. The circuit of claim 5, wherein the sampling circuitry comprises at least one sampling flip flop.

7. The circuit of claim 5, wherein the pulse generation circuitry comprises at least one logic gate.

8. The circuit of claim 1, wherein the phase indeterminate circuit element comprises a clock divider.

9. The circuit of claim 1, further including an integrated circuit, and wherein the phase lock circuit is included in the integrated circuit.

10. The circuit of claim 1, further comprising a feedback element configured to receive the output signal and to produce a feedback signal that is separate from the phase lock pulse, wherein the phase indeterminate circuit element is configured to receive the feedback signal.

11. The circuit of claim 10, further comprising combinational logic configured to receive the feedback signal and the phase lock pulse and to produce a combined signal, the combined signal being coupled to an input of the phase indeterminate circuit element.

12. A phase lock circuit, comprising:
    input means for receiving an input phase lock signal;
    timing means for generating a timing signal;
    means for generating a phase lock pulse based on the phase lock signal and the timing signal; and
    a phase indeterminate means in communication with the timing means and the means for generating a phase lock pulse, the phase indeterminate means for generating an output signal based on the phase lock pulse and having a known phase relationship to the timing signal.

13. The circuit of claim 12, wherein the means for generating a phase lock pulse based on the phase lock signal and the timing signal comprises:
    sampling means for generating a sampling output based on the phase lock signal, the sampling output having a known phase relationship to the timing signal; and
    pulse generation means for generating the phase lock pulse based on the sampling output.

14. The circuit of claim 13, wherein the sampling means comprises at least one sampling flip flop.

15. The circuit of claim 13, wherein the pulse generation means comprises at least one logic gate.

16. The circuit of claim 12, wherein the means for generating a phase lock pulse based on the phase lock signal and the timing signal comprises:
    means for generating an output pulse based on the phase lock signal; and
    sampling means for generating the phase lock pulse based on the output pulse, the phase lock pulse having a known phase relationship to the timing signal.

17. The circuit of claim 16, wherein the sampling means comprises at least one sampling flip flop.

18. The circuit of claim 16, wherein the means for generating an output pulse comprises at least one logic gate.

19. The circuit of claim 12, wherein the phase indeterminate means comprises a clock dividing means.

20. The circuit of claim 12, further including an integrated circuit, and wherein the phase lock circuit is included in the integrated circuit.

21. A method of testing a circuit, comprising:
    receiving a phase lock signal on a circuit input;
    receiving a clock signal;
    generating a phase lock pulse based on the phase lock signal and the clock signal;
    receiving the phase lock pulse in a phase indeterminate circuit element; and
    generating an output of the phase indeterminate circuit element, the output of the phase indeterminate circuit element having a known phase relationship to the clock signal.

22. The method of claim 21, wherein the phase indeterminate circuit element is a clock divider.

23. The method of claim 21, wherein generating the phase lock pulse based on the phase lock signal and the clock signal comprises:
    generating a first signal based on the phase lock signal and the clock signal; and
    generating the phase lock pulse based on the first signal.

24. The method of claim 23, wherein generating the first signal based on the phase lock signal and the clock signal comprises delaying the phase lock signal to substantially synchronize at least a portion of the first signal with at least a portion of the clock signal.

25. The method of claim 21, wherein generating the phase lock pulse based on the phase lock signal and the clock signal comprises:
    generating a first pulse based on the phase lock signal; and
    generating the phase lock pulse based on the first pulse.

26. The method of claim 25, wherein generating the phase lock pulse based on the first pulse comprises delaying the first pulse to substantially synchronize at least a portion of the first pulse with at least a portion of the clock signal.

27. The method of claim 21, further comprising:
    insert test input data on a test input of the circuit; and
    receiving test output data on a test output of the circuit.

28. The method of claim 27, further comprising comparing the test output data to simulation data.

29. The method of claim 28, wherein the simulation data is based on the known phase relationship.

30. A phase lock circuit, comprising:
an input configured to receive a phase lock signal;
a clock configured to generate a clock signal;
phase lock circuitry in communication with the input and the clock, the phase lock circuitry configured to generate a phase lock pulse based on the phase lock signal and the clock signal, wherein the phase lock circuitry comprises:
sampling circuitry configured to generate a sampling output based on the phase lock signal, the sampling output having a known phase relationship to the clock signal, and
pulse generation circuitry configured to generate the phase lock pulse based on the sampling output; and
a phase indeterminate circuit element, the phase indeterminate circuit element configured to receive the phase lock pulse and to generate an output signal based on the phase lock pulse, the output signal having a known phase relationship to the clock signal.

31. A phase lock circuit, comprising:
an input configured to receive a phase lock signal;
a clock configured to generate a clock signal;
phase lock circuitry in communication with the input and the clock, the phase lock circuitry configured to generate a phase lock pulse based on the phase lock signal and the clock signal, wherein the phase lock circuitry comprises:
pulse generation circuitry configured to generate an output pulse based on the phase lock signal, and
sampling circuitry configured to generate the phase lock pulse based on the output pulse, the phase lock pulse having a known phase relationship to the clock signal; and
a phase indeterminate circuit element, the phase indeterminate circuit element configured to receive the phase lock pulse and to generate an output signal based on the phase lock pulse, the output signal having a known phase relationship to the clock signal.

32. A phase lock circuit, comprising:
input means for receiving an input phase lock signal;
timing means for generating a timing signal;
means for generating a phase lock pulse based on the phase lock signal and the timing signal, wherein the means for generating the phase lock pulse based on the phase lock signal and the timing signal comprises:
sampling means for generating a sampling output based on the phase lock signal, the sampling output having a known phase relationship to the timing signal, and
pulse generation means for generating the phase lock pulse based on the sampling output; and
a phase indeterminate means in communication with the timing means and the means for generating a phase lock pulse, the phase indeterminate means for generating an output signal based on the phase lock pulse and having a known phase relationship to the timing signal.

33. A phase lock circuit, comprising:
input means for receiving an input phase lock signal;
timing means for generating a timing signal;
means for generating a phase lock pulse based on the phase lock signal and the timing signal, wherein the means for generating the phase lock pulse based on the phase lock signal and the timing signal comprises:
means for generating an output pulse based on the phase lock signal, and
sampling means for generating the phase lock pulse based on the output pulse, the phase lock pulse having a known phase relationship to the timing signal; and
a phase indeterminate means in communication with the timing means and the means for generating a phase lock pulse, the phase indeterminate means for generating an output signal based on the phase lock pulse and having a known phase relationship to the timing signal.

34. A method of testing a circuit, comprising:
receiving a phase lock signal on a circuit input;
receiving a clock signal;
generating a phase lock pulse based on the phase lock signal and the clock signal, wherein generating the phase lock pulse based on the phase lock signal and the clock signal comprises:
generating a first signal based on the phase lock signal and the clock signal, and
generating the phase lock pulse based on the first signal;
receiving the phase lock pulse in a phase indeterminate circuit element; and
generating an output of the phase indeterminate circuit element, the output of the phase indeterminate circuit element having a known phase relationship to the clock signal.

35. A method of testing a circuit, comprising:
receiving a phase lock signal on a circuit input;
receiving a clock signal;
generating a phase lock pulse based on the phase lock signal and the clock signal, wherein generating the phase lock pulse based on the phase lock signal and the clock signal comprises:
generating a first pulse based on the phase lock signal, and
generating the phase lock pulse based on the first pulse;
receiving the phase lock pulse in a phase indeterminate circuit element; and
generating an output of the phase indeterminate circuit element, the output of the phase indeterminate circuit element having a known phase relationship to the clock signal.

* * * * *